(12) United States Patent
Huang et al.

(10) Patent No.: US 8,448,288 B2
(45) Date of Patent: May 28, 2013

(54) SEMICONDUCTOR EQUIPMENT

(75) Inventors: Chien-Ping Huang, Tainan (TW);
Tsan-Hua Huang, Tainan (TW);
Tsung-Hsun Han, Kaohsiung (TW)

(73) Assignee: Hermes-Epitek Corporation, Taipei (TW)

( * ) Notice: Subject to any disclaimer, the term of this patent is extended or adjusted under 35 U.S.C. 154(b) by 444 days.

(21) Appl. No.: 12/726,183

(22) Filed: Mar. 17, 2010

(65) Prior Publication Data
US 2011/0186078 A1 Aug. 4, 2011

(30) Foreign Application Priority Data
Feb. 1, 2010 (TW) .............................. 99102839 A

(51) Int. Cl.
*H01L 21/00* (2006.01)
*B08B 1/04* (2006.01)
(52) U.S. Cl.
USPC ............... 15/246.5; 15/21.1; 15/77; 15/88.3; 15/88.4; 118/70; 118/302; 134/104.1; 134/902; 239/115; 438/905
(58) Field of Classification Search
USPC .......... 15/21.1, 77, 88.1–88.4, 246.5; 118/52, 118/56, 319, 320, 70, 302, 500; 134/104.1, 134/902; 239/114–118, 123, 251; 438/905
See application file for complete search history.

(56) References Cited

U.S. PATENT DOCUMENTS

| 5,966,635 | A | * | 10/1999 | Hiatt et al. | 438/795 |
| RE36,767 | E | * | 7/2000 | Itzkowitz | 15/77 |
| 6,254,690 | B1 | * | 7/2001 | Ueki | 134/6 |
| 6,381,796 | B1 | * | 5/2002 | Sato | 15/77 |
| 2004/0181885 | A1 | * | 9/2004 | Aoki et al. | 15/21.1 |

FOREIGN PATENT DOCUMENTS

| JP | 10-154674 | * | 6/1998 |
| JP | 10-294261 | * | 11/1998 |
| JP | 2002-33301 | * | 1/2002 |
| JP | 2002-263589 | * | 9/2002 |
| JP | 2005-310941 | * | 11/2005 |

* cited by examiner

*Primary Examiner* — Mark Spisich
(74) *Attorney, Agent, or Firm* — Stout, Uxa, Buyan & Mullins, LLP

(57) ABSTRACT

Semiconductor equipment is provided to include a reaction chamber, a movable frame, and at least one cleaning brush head. The cleaning brush head is configured to operate on at least one dirty portion to be cleaned within the reaction chamber. The movable frame is disposed within the reaction chamber. The movable frame is capable of carrying a susceptor. The cleaning brush head is capable of touching the dirty portion. The cleaning brush head is capable of moving relative to the dirty portion for removing the residue which is attached to the portion to be cleaned.

5 Claims, 4 Drawing Sheets

SEMICONDUCTOR EQUIPMENT

CROSS-REFERENCE TO RELATED APPLICATIONS

The entire contents of Taiwan Patent Application No. 099102839, filed on Feb. 1, 2010, from which this application claims priority, are incorporated herein by reference.

BACKGROUND OF THE INVENTION

1. Field of the Invention

The present invention generally relates to semiconductor equipment, and more particularly to semiconductor equipment having an auto cleaning function.

2. Description of Related Art

Semiconductor manufacturing equipment is commonly used in the production of semiconductor components. The semiconductor manufacturing equipment typically has a reaction chamber. The reaction gases required by the semiconductor manufacturing process can be provided into the reaction chamber by a showerhead of the reaction chamber. The residues, such as deposited material or contaminants, may be attached within the reaction chamber after several executions of semiconductor manufacturing processes. Thus, process results and the process yields are affected by the residues.

Generally speaking, the residues within the reaction chamber can be removed by specific reaction gases. On the other hand, the residues within the reaction chamber can be removed manually when the reaction chamber is opened. However, using specific reaction gases to remove the residues within the reaction chamber is usually ineffective. Removing the residues within the reaction chamber manually with the reaction chamber opened usually leads to bad results, such as long maintenance times, unstable process results, and so on.

For the reason that there are some disadvantages of the prior art as mentioned above, a need exists to propose semiconductor equipment having an auto cleaning function. The semiconductor equipment should be capable of removing the residues within the reaction chamber by a cleaning brush.

SUMMARY OF THE INVENTION

Accordingly, the present invention has been made in order to meet such a need as described above, it being an object of the present invention to provide semiconductor equipment having an auto cleaning function. The semiconductor equipment is capable of removing residues within a reaction chamber with a cleaning brush.

In order to achieve the above object, the present invention provides improved semiconductor equipment. The semiconductor equipment includes a reaction chamber, a movable frame, and at least one cleaning brush head. The cleaning brush head is configured to operate on at least one dirty portion to be or in need of being cleaned within the reaction chamber. The movable frame is disposed within the reaction chamber. The movable frame is capable of carrying a susceptor. The cleaning brush head is capable of touching the dirty portion. The cleaning brush head is capable of moving relative to the dirty portion for removing the residue which is attached to the portion to be cleaned.

DETAILED DESCRIPTION OF THE INVENTION

A detailed description of the present invention will be provided in connection with the following embodiments, which are not intended to limit the scope of the present invention and which can be adapted for other applications. While the drawings are illustrated in detail, it is appreciated that the quantity of the disclosed components may be greater or less than that disclosed except for instances expressly restricting the amount of the components.

Figure 1:
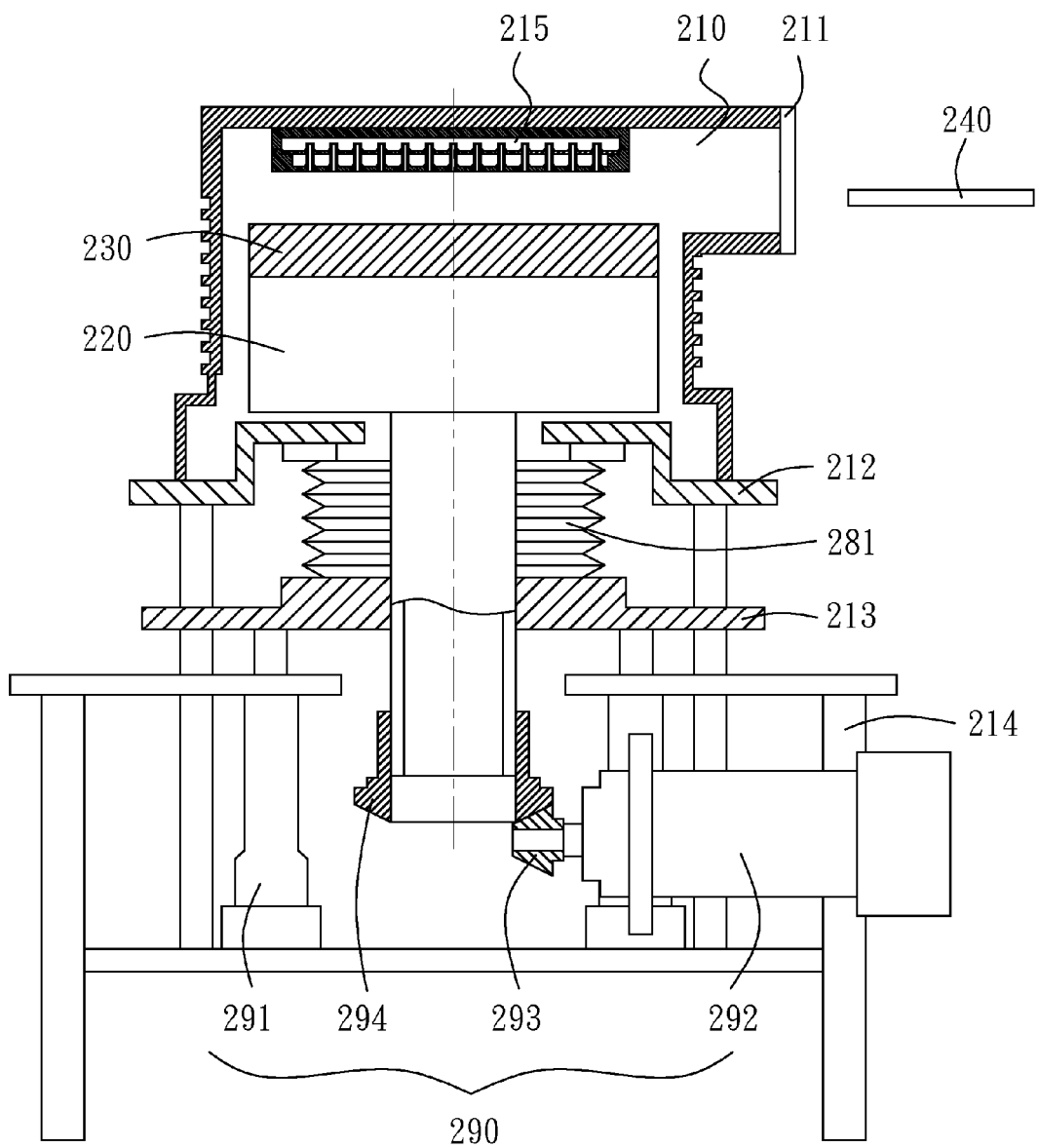
FIG. 1 shows a side view of semiconductor equipment in accordance with a preferred embodiment of the present invention.

FIG. 1 shows a side view of semiconductor equipment 200 in accordance with a preferred embodiment of the present invention. The semiconductor equipment 200 includes a reaction chamber 210, a movable frame 220, and a robot arm 240. The reaction chamber 210 in turn includes a showerhead 215. Hence, reaction gases required by the semiconductor manufacturing process can be provided into the reaction chamber 210 by way of the showerhead 215. The showerhead 215 is disposed on an upper portion of the reaction chamber 210. The movable frame 220 is disposed within the reaction chamber 210. The movable frame 220 is capable of carrying a susceptor 230. The susceptor 230 is capable of carrying at least one wafer. The movable frame 220 is able to make the susceptor 230 move vertically and/or rotate.

The semiconductor equipment 200 can further include a first frame 214, a second frame 213, a third frame 212, a transmission device 290, and a flexible catheter 281. The transmission device 290 in turn includes a linear transmission device 291. The linear transmission device 291 is disposed between the first frame 214 and the second frame 213. Hence, by way of the linear transmission device 291, the second frame 213 can move vertically relative to the first frame 214. The movable frame 220 is disposed on the second frame 213. When the second frame 213 moves vertically, the movable frame 220 also moves vertically. The flexible catheter 281 is disposed between the third frame 212 and the second frame 213. The flexible catheter 281 is used to prevent the gases within the reaction chamber 210 from leaking to the outside of the reaction chamber 210. The transmission device 290 includes a rotation transmission device. In this embodiment, the rotation transmission device includes a motor 292 and a gear assembly 293. Power from the motor 292 is transmitted to the movable frame 220 by the gear assembly 293 so as to make the movable frame 220 rotate.

Figure 2A:
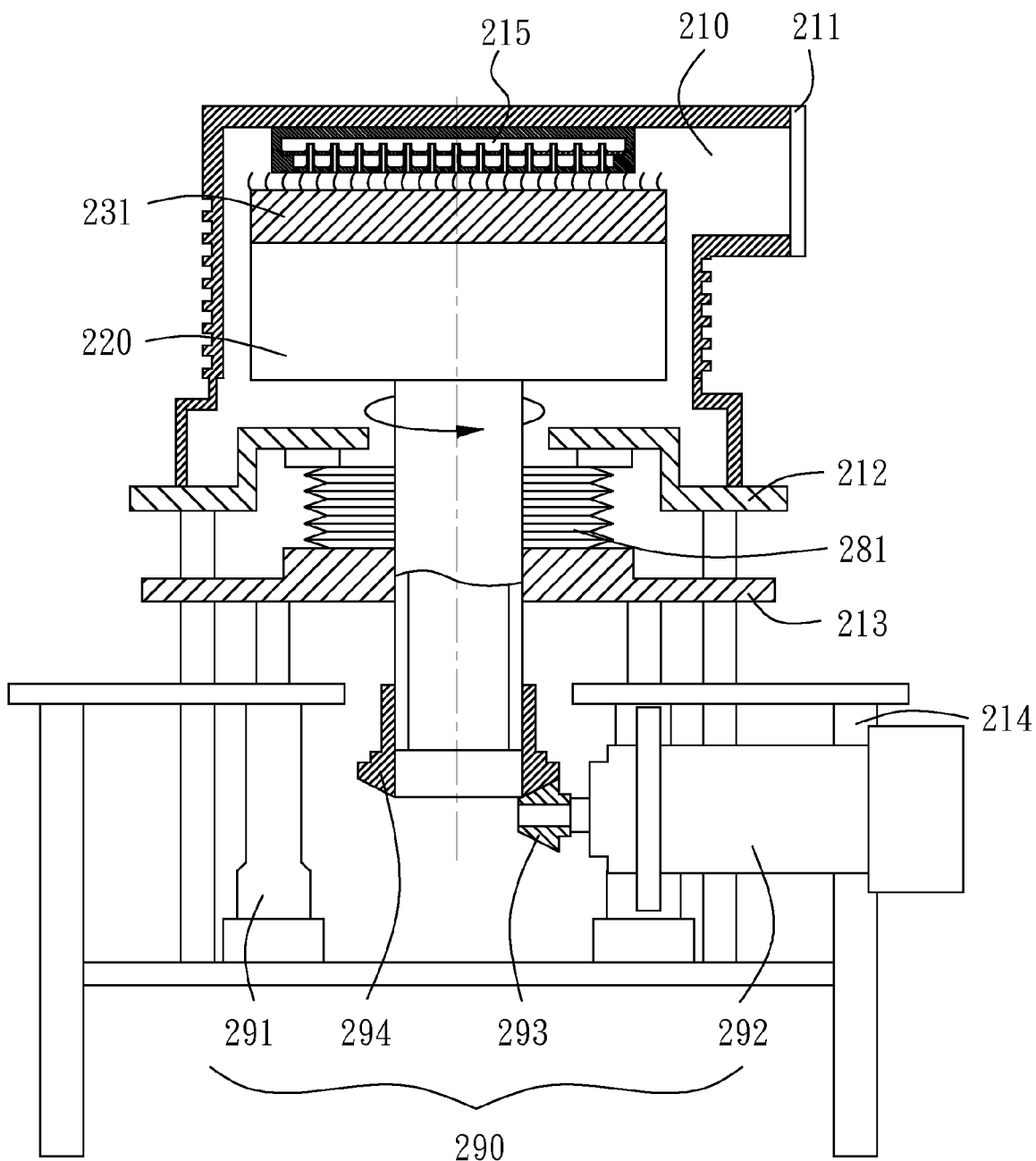
FIG. 2A shows an operation method of the semiconductor equipment shown in FIG. 1.

FIG. 2A elucidates an operation method of the semiconductor equipment shown in FIG. 1. After several executions of semiconductor manufacturing processes, residues, such as in the form of deposited material and/or contaminants, may become attached to at least one portion (i.e., a dirty portion to be cleaned) on or within the reaction chamber 210. In FIG. 2A, the dirty portion is positioned on an upper portion of the reaction chamber 210. For example, the dirty portion can include the showerhead 215 mentioned above. The susceptor 231 can be moved to the inside of the reaction chamber 210 by the robot arm 240 (FIG. 1), wherein the susceptor 231 includes at least one cleaning implement such as a cleaning brush head. Following placement of the susceptor 231 on the movable frame 220, the movable frame 220 can be moved vertically so as to make the cleaning brush head touch the dirty portion. The movable frame 220 can be moved (e.g., rotated) so as to make the cleaning brush head move relative to the dirty portion for removing the residue attached to the dirty portion. After the cleaning steps mentioned above, proper gases can be purged into the reaction chamber 210 so as to remove related particles. Moreover, a high temperature baking process can be used for the inside of the reaction chamber 210 for a proper period of time so as to remove related residue.

Figure 2B:
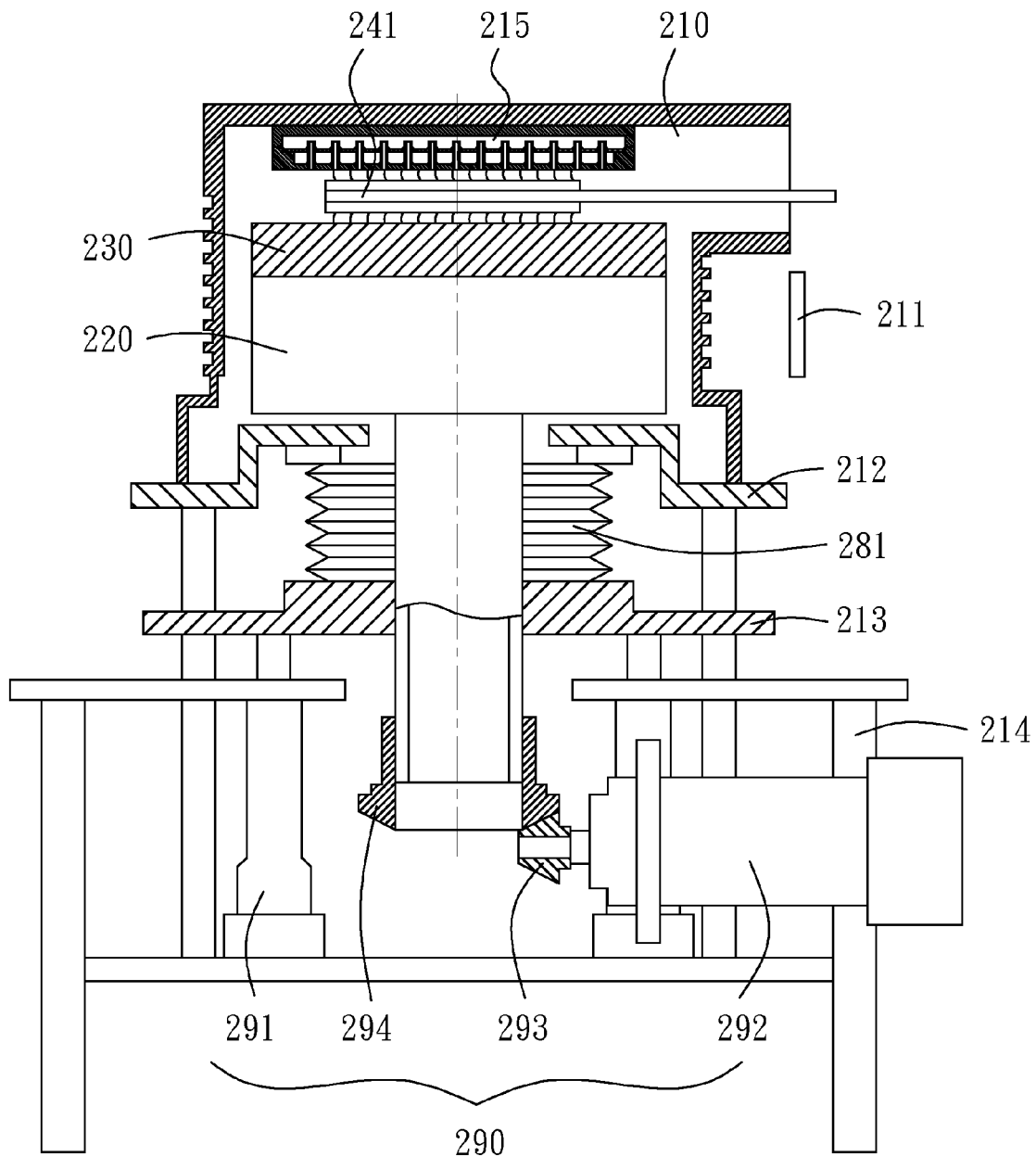
FIG. 2B shows another operation method of the semiconductor equipment shown in FIG. 1.

FIG. 2B depicts another operation method of the semiconductor equipment shown in FIG. 1. Following several semiconductor manufacturing processes, residues, such as deposited material and/or contaminants, may be present at one or more dirty portions to be cleaned on or within the reaction chamber 210. Consistent with that shown in FIG. 2B, the dirty portion, can be positioned at (e.g., on) an upper portion and/or a lower portion of (e.g., within) the reaction chamber 210. For example, the dirty portion can include the showerhead 215 and/or the susceptor 230 mentioned above. First, the gate valve 211 can be opened. Using the robot arm 240 (FIG. 1), for example, a cleaning device 241 having at least one cleaning implement such as a cleaning brush head can be moved (e.g., to the inside of the reaction chamber 210) so as to make the cleaning brush head touch the dirty portion. The cleaning device 241 can include a driving device, the driving device being capable of making the cleaning brush head move (e.g., linearly and/or rotationally) so as to loosen and/or remove residue attached on the dirty portion. The cleaning device 241 can be disposed on the robot arm 240 directly, or the cleaning device 241 can be a separate device which is moved by the robot arm 240.

Figure 2C:
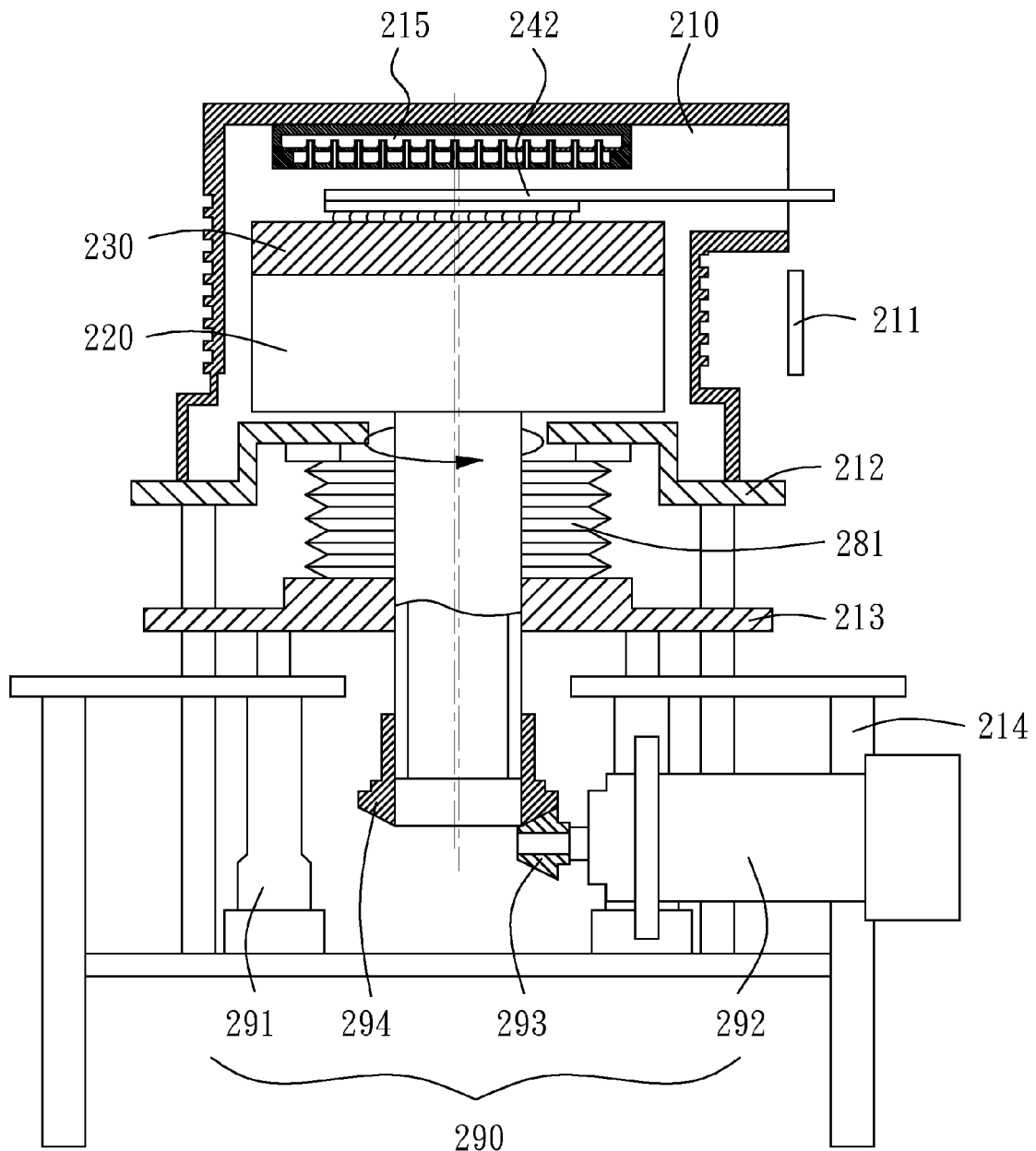
FIG. 2C shows another operation method of the semiconductor equipment shown in FIG. 1.

FIG. 2C corresponds to yet another operation method of the semiconductor equipment shown in FIG. 1. After performance several times of semiconductor manufacturing processes, residues (e.g., undesired material and/or contaminants) may exist at (e.g., be attached to) at least one dirty portion to be cleaned on or within the reaction chamber 210. According to FIG. 2C, the dirty portion can be positioned on a lower portion of (e.g., within) the reaction chamber 210. For example, the dirty portion can include the susceptor 230. First, the gate valve 211 can be opened. By operation of, for example, the robot arm 240 (FIG. 1), a cleaning device 242 having at least one cleaning implement such as a cleaning brush head can be positioned in close proximity to (e.g., moved to the inside of) the reaction chamber 210 so as to cause contacting of (e.g., to make the cleaning brush head touch) the dirty portion. Then, the movable frame 220 can be moved (e.g., rotated) so as to make the cleaning brush head move relative to the dirty portion for causing loosening and/or removal of the residue on the dirty portion. The cleaning device 242 can be disposed on the robot arm 240 directly, or the cleaning device 242 can be a separate device which is moved by the robot arm 240.

By using the semiconductor equipment of the present invention, a cleaning brush head can provide the capability of removing residue attached within the reaction chamber without the need for having to open the reaction chamber. Thus, maintenance time is decreased, with the process and its result being improved.

The present invention contemplates and provides a method for cleaning semiconductor equipment. The method includes the following steps. Referring to FIGS. 2A-2C, semiconductor equipment is provided, the semiconductor equipment having a reaction chamber, wherein at least one dirty portion to be cleaned is positioned on or within the reaction chamber. Then, at least one cleaning implement such as a cleaning brush head is provided, followed by the cleaning brush head touching the dirty portion, whereby the cleaning brush is moved relative to the dirty portion causing or being accompanied with loosening and/or removing of residue attached to the dirty portion.

As shown in FIG. 2A, the dirty portion is positioned on an upper portion of the reaction chamber 210, and the cleaning brush head is disposed on a susceptor 231. The susceptor 231 is capable of moving vertically so as to make the cleaning brush head touch the dirty portion, and the susceptor 231 is capable of rotating so as to make the cleaning brush head move commensurately relative to the dirty portion for removing the residue attached to the dirty portion. While in this embodiment, the dirty portion can include a showerhead 215, it not limited to this.

As shown in FIG. 2B, the cleaning brush head is disposed on a cleaning device 241. The cleaning device 241 includes a driving device, wherein the driving device is capable of making the cleaning brush head move or rotate. In this and/or other embodiment(s), the cleaning device is moved to the inside of the reaction chamber 210 by way of, for example, a robot arm so as to make the cleaning brush head touch the dirty portion, but such is not limited, whereby other means may be used to this or a related end, so long as, according to some examples but without limitation in others, the cleaning brush head can be disposed on, or moved by, an implement such as the robot arm, and/or to the extent used, the robot arm can be capable of making the cleaning brush head become operational on (e.g., touch) the dirty portion.

As shown in FIG. 2C, the dirty portion is positioned on a lower portion of the reaction chamber 210. The movable frame 220 is capable of rotating so as to make the cleaning brush head move relative to the dirty portion for removing the residue attached to the dirty portion. In this embodiment, the dirty portion can include a susceptor, but is not limited to this.

Although specific embodiments have been illustrated and described, it will be appreciated by those skilled in the art that various modifications may be made without departing from the scope of the present invention, which is intended to be limited solely by the appended claims.

What is claimed is:

1. Semiconductor equipment, comprising:
   a reaction chamber, wherein at least one dirty portion to be cleaned is positioned within said reaction chamber;
   a movable frame, wherein said movable frame is disposed within said reaction chamber, said movable frame being capable of carrying a susceptor; and
   a first cleaning brush head, wherein said first cleaning brush head is capable of touching said dirty portion, said first cleaning brush head having an arrangement capable of movement relative to said dirty portion for removal residue attached to said dirty portion; and
   a robot arm, wherein said robot arm is structured to be capable of moving said susceptor to the inside of said reaction chamber;
   wherein said dirty portion is positioned on an upper portion of said reaction chamber and comprises a showerhead positioned on the upper portion of said reaction chamber, said first cleaning brush head is disposed on said susceptor, said movable frame is capable of moving vertically so as to make said first cleaning brush head touch said dirty portion, and said movable frame is capable of rotating so as to make said first cleaning brush head move relative to said dirty portion for removing said residue attached to said dirty portion.

2. The semiconductor equipment according to claim 1, wherein a second cleaning brush head is disposed on said robot arm, and said robot arm is capable of making said second cleaning brush head touch said dirty portion.

3. The semiconductor equipment according to claim 2, wherein said dirty portion is positioned on a lower portion of said reaction chamber, and said robot arm is capable of rotating so as to make said second cleaning brush head move relative to said dirty portion for removing residue attached to said dirty portion.

4. The semiconductor equipment according to claim 3, wherein said dirty portion comprises said susceptor.

5. The semiconductor equipment according to claim 1, further comprising a gear device, wherein said gear device is capable of making said movable frame rotate.

* * * * *